United States Patent [19]
Narita

[11] Patent Number: 5,844,281
[45] Date of Patent: Dec. 1, 1998

[54] SEMICONDUCTOR INTEGRATED CIRCUIT DEVICE WITH ELECTROSTATIC PROTECTIVE FUNCTION

[75] Inventor: Kaoru Narita, Tokyo, Japan

[73] Assignee: NEC Corporation, Tokyo, Japan

[21] Appl. No.: 585,864

[22] Filed: Jan. 11, 1996

[30] Foreign Application Priority Data

Jan. 11, 1995 [JP] Japan ................................ 7-002319

[51] Int. Cl.⁶ ........................................ H01L 23/62
[52] U.S. Cl. ................ 257/356; 257/360; 257/363; 257/379; 257/382; 257/384
[58] Field of Search .................... 257/355–360, 257/363, 379, 380, 382, 383, 384

[56] References Cited

U.S. PATENT DOCUMENTS 4,952,994  8/1990  Lin ........................................... 257/360

FOREIGN PATENT DOCUMENTS 0109070  5/1984  European Pat. Off. .
5987873  5/1984  Japan .
3073569  3/1991  Japan .
4062838  2/1992  Japan .

*Primary Examiner*—Minh-Loan Tran

[57] ABSTRACT

An input terminal and an input protective resistor of an N-type diffusion layer connected thereto are provided on a P-type semiconductor substrate. First and second N-type MOS transistors for internal circuit are connected to a grounding wiring at respective source diffusion layers. The first MOS transistor is located at closer distance from the input protective resister than the second MOS transistor. The source diffusion layer of the first MOS transistor and the grounding wiring are connected via a high melting point metal layer wiring, such as a tungsten silicide or so forth to increase a resistance to improve electrostatic breakdown potential. Accordingly, the distance between the input protective resistor and the first MOS transistor can be made smaller to eliminate dead space around the input protective resistor to enable reduction of a chip area.

10 Claims, 10 Drawing Sheets

SEMICONDUCTOR INTEGRATED CIRCUIT DEVICE WITH ELECTROSTATIC PROTECTIVE FUNCTION

BACKGROUND OF THE INVENTION

1. Field of the Invention

The present invention relates to a semiconductor integrated citrcuit device having an electrostatic protective function.

2. Description of the Related Art

Conventional electrostatic protection for a semiconductor integrated circuit will be discussed with taking the technology disclosed in Japanese Unexamined Patent Publication (Kokai) No. Showa 59-87873 as example. FIG. 10 shows a layout in the vicinity of an input terminal of a MOSLSI formed on a P-type semiconductor substrate. An input terminal 1 is connected to an input protective resistor 4 formed with an N-type diffusion layer via a contact 7. The input terminal 1 thus feeds a signal into the inside of the MOSLSI via the input protective resistor 4. At a position spaced from the N-type diffusion layer 4 in a magnitude of a distance d, an N-type MOSFET (MOS field effect transistor) 10 for an internal circuit having an N-type source diffusion layer 5 connected to a grounding wiring 3 is formed. A drain diffusion layer 8 of this MOSFET 10 is often connected to other MOSFET. For instance, in case of CMOSLSI, the drain diffusion layer 8 of the MOSFET 10 is connected to P-type MOSFET (not shown). It should be noted that the reference numeral 9 denotes a gate electrode of the MOSFET 10, and 2 denotes a grounding terminal, 3 denotes a grounding wiring, and 71 denotes a contact.

In case of the conventional MOSLSI constructed as set forth above, a problem is encounted in that the distance d has to be 100 $\mu$m to 300 $\mu$m for obtaining sufficiently high electrostatic protection potential. Namely, when a negative electrostatic pulse is applied to the input terminal 1 with respect to the potential of the grounding terminal 2, electron is injected to the P-type semiconductor substrate from the N-type diffusion layer 4 and reaches to the source diffusion layer 5 of the N-type MOSFET 10 by diffusion.

Here, due to high electric field generated at the junction of the source diffusion layer, the electron becomes high energy to cause breakdown in the diffusion layer or the gate oxide layer. Accordingly, no internal elements can be arranged in a region of several hundreds $\mu$m in the vicinity of the input terminal to cause wasting of the area. This clearly borders reduction of a chip area. Particularly, under the current trend where number of demanded terminals is progressively increasing, presence of the dead space as set forth above is quite disadvantages in down-sizing of the chip area.

FIG. 11 shows an example of one solution for the problem set forth above, in which an N-type well 6 of the grounding potential is provided for absorbing the electron injected from the N-type diffusion layer 4. Even in this case, satisfactory effect may not be expected since large amount of electron reaches the source diffusion layer 5 of the N-type MOSFET 10 via a deeper region than the well 6 in the P-type semiconductor substrate. Since the N-well 6 ocupies a certain area, a dead space is inherently present around the input terminal.

FIG. 12 is an explanatory illustration for explaining the presence of the dead spaces not only in the vicinity of the input terminals but also within the MOSFET. Namely, a source diffusion layer 51 of a MOSFET 101 is connected to a grounding wiring 31, and a source diffusion layer 52 of a MOSFET 102 is connected to a grounding wiring 32. The grounding wiring 31 and 32 are respectively connected to independent grounding terminals 21 and 22. The reference numerals 81 and 82 are drain diffusion layers, 91 and 92 are gate electrodes, of MOSFETs 101 and 102 respectively.

When an electrostatic pulse in negative potential is applied to the grounding terminal 21 with respect to the grounding terminal 22, similarly to the discussion set forth above, electron is injected to the semiconductor substrate from a source diffusion layer 51 of the MOSFET 101 connected to the grounding wiring 31, and then the electron diffuses to a source diffusion layer 52 of the MOSFET 102 connected to the grounding wiring 32 to cause breakdown of the diffusion layers and/or the gate oxide layers. Therefore, the distance d is inherently set to be sufficiently large, e.g. 100 $\mu$m to 300 $\mu$m. Accordingly, a large number of dead spaces are present even in the internal circuit to be a cause of bordering for reduction of the chip area.

Separating of the grounding wiring as in the foregoing example is necessary for avoiding malfunction of the circuit block due to noise generated in certain circuit block. Especially, according to increasing of complicatedness of functions of LSI, the grounding wiring and the power source wiring have to be divided into greater numbers.

On the other hand, another example in avoidance of electrostatic breakdown has been disclosed in Japanese Unexamined Patent Publication No. Heisei 4-62838. The example takes a construction, in which a high melting point conductive material is inserted between an aluminum wiring and a diffusion layer. By this, reaction to a lower diffusion layer by melting of aluminum of an upper portion of the diffusion layer of an input protective resistance is prevented. However, the shown construction is not intended to protect the diffusion layer in the internal circuit located in the vicinity of the diffusion layer of the input protective resistor from breakdown by injected electron.

SUMMARY OF THE INVENTION

It is an object of the present invention to provide a semiconductor device for achieving high package density enabling prevention of electrostatic breakdown even when dead space is eliminated.

Another object of the present invention is to provide a semiconductor integrated circuit device which can effectively prevent breakdown of diffusion layer of an internal circuit in the vicinity of diffusion layer of an input protective resistor.

According to a first aspect of the invention, a semiconductor device comprises:

a semiconductor substrate of a first conducive type;

first and second terminals formed on one major surface of the semiconductor substrate;

first and second wiring layers respectively connected to the first and second terminals;

a first diffusion layer of a second conductive type selectively formed on one major surface of the semiconductor substrate and connected to the first wiring layer;

a first field effect transistor located in the semiconductor substrate within a predetermined distance relative to the first diffusion layer and having drain or source diffusion layer connected to the second wiring;

a second field effect transistor located in the semiconductor substrate in a distance greater than the predetermined distance from the first diffusion layer and having drain or source diffusion layer connected to the second wiring, a distance from the second wiring layer to an end of gate electrode of drain or source diffusion layer, to which the second wiring layer is connected, in the first field effect transistor being greater than that of the second field effect transistor.

According to a second aspect of the invention, a semiconductor device comprises:

a first diffusion layer of a second conductive type provided on a semiconductor layer of a first conductive type;

a second diffusion layer of a second conductive type provided in opposition to the first diffusion layer;

a first power source wiring connected to the second diffusion layer;

a third diffusion layer located to a distance from the first diffusion layer greater than that between the first diffusion layer and the second diffusion layer; and a second power source wiring connected to the third diffusion layer, a connection impedance between the second diffusion layer and the first power source wiring being greater than a connection impedance between the third diffusion layer and the second power source wiring.

According to a third aspect of the invention, a semiconductor device comprises:

a first diffusion layer of a second conducive type provided on a semiconductor substrate of a first conductive type;

a field effect transistor having a source or drain diffusion layer of the second conductive type, a gate electrode and drain or source diffusion layer of the second conductive type;

an internal circuit wiring connected to the source or drain diffusion layer; and a power source wiring connected to the drain or source diffusion layer, a connection impedance of the drain or source diffusion layer and the power source wiring being greater than a connection impedance between the source or drain diffusion layer and the internal circuit wiring.

According to a fourth aspect of the invention, a semiconductor device comprising:

a first diffusion layer of a second conducive type on a semiconductor substrate of a first conductive type;

a field effect transistor provided in opposition to the first diffusion layer and having a source diffusion layer and a drain diffusion layer of the second conductive type and a gate electrode provided between the source and drain diffusion layers;

a power source wiring connected to the source diffusion layer or the drain diffusion layer with a first contact opening;

an internal circuit wiring connected to the drain diffusion layer or the source diffusion layer via a second contact opening;

a distance between the first contact opening and the gate electrode is greater than a distance between the second contact opening and the gate electrode.

According to a fifth aspect of the invention, a semiconductor device comprising:

a first diffusion layer of a second conductive type connected to a first power source wiring provided on a semiconductor substrate of a first conductive type;

a second diffusion layer of a second conductive type connected to a second power source wiring provided in opposition to the first diffusion layer; and a third diffusion layer of a second conductive type connected to an internal circuit wiring, a connection impedance between the first power source wiring and the first diffusion layer and a connection impedance between the second power source wiring and said second diffusion layer being greater than a connection impedance between said internal circuit wiring and said third diffusion later.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The preferred embodiments of a semiconductor integrated circuit device according to the present invention will be discussed hereinafter with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
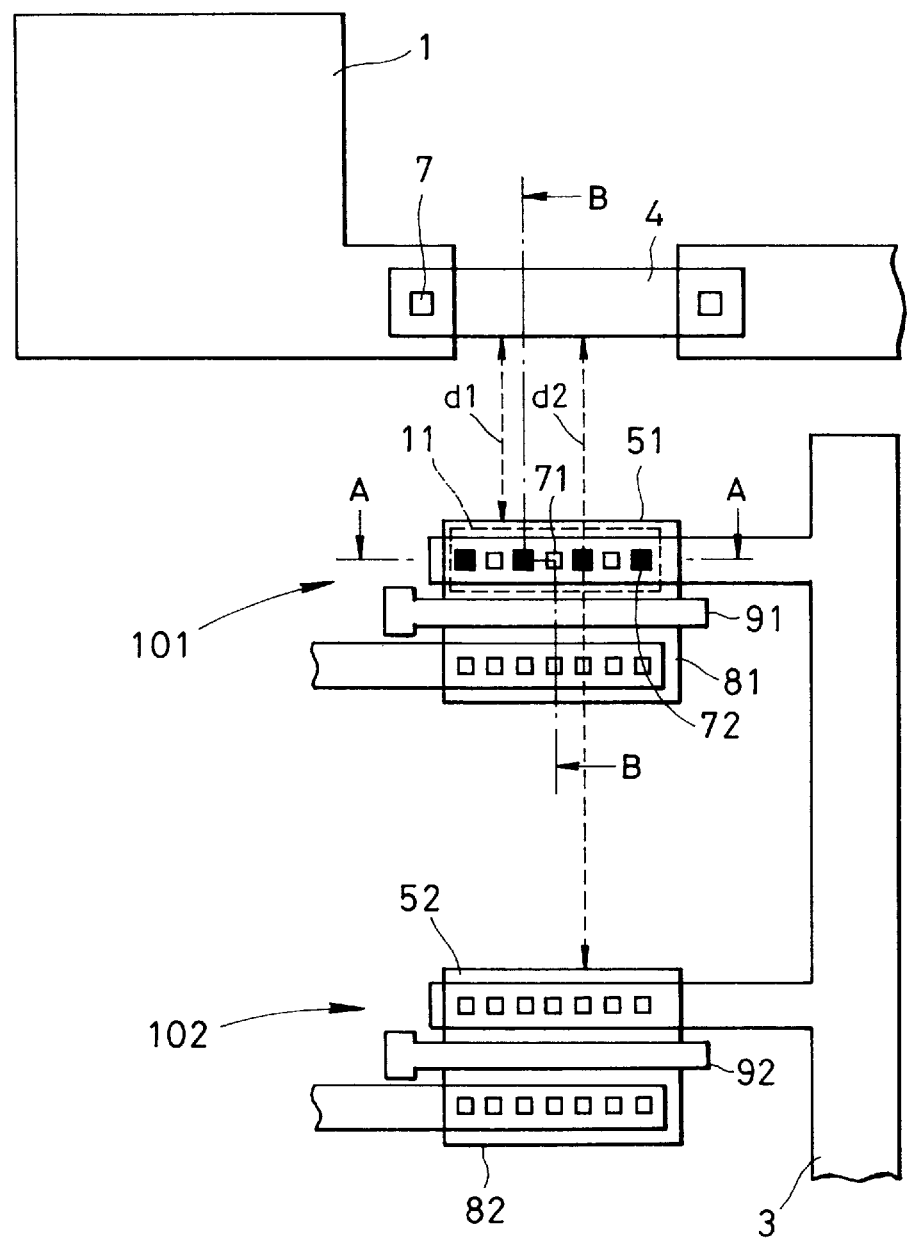
FIG. 1 is an illustration of a layout of one embodiment of a semiconductor integrated circuit device according to the present invention.
Figure 2:
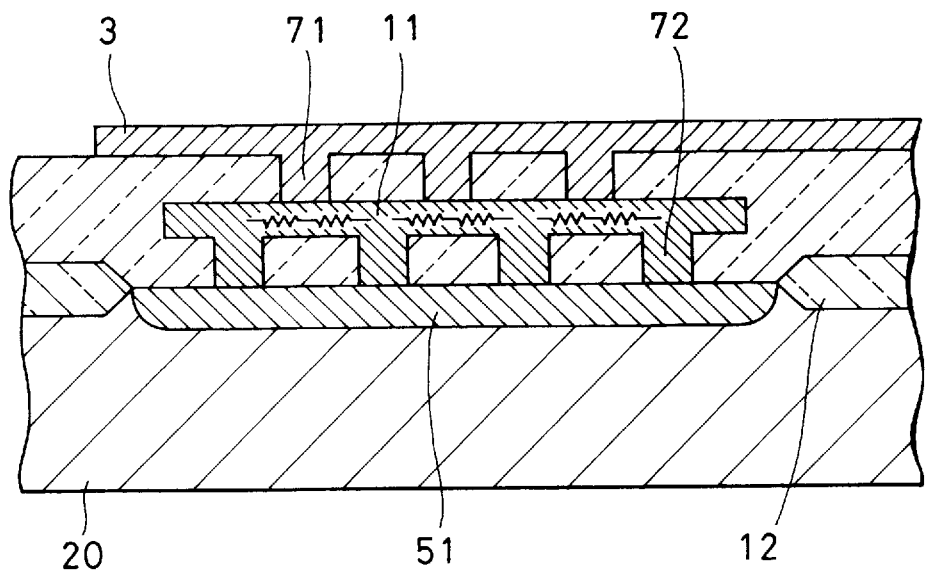
FIG. 2 is a section taken along line A—A of FIG. 1.
Figure 3:
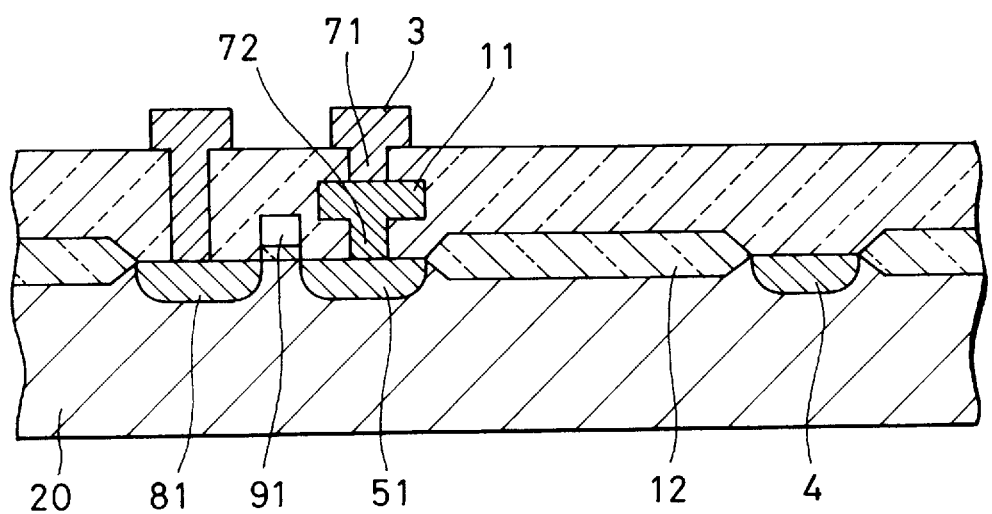
FIG. 3 is a section taken along line B—B of FIG. 1.
Figure 11:
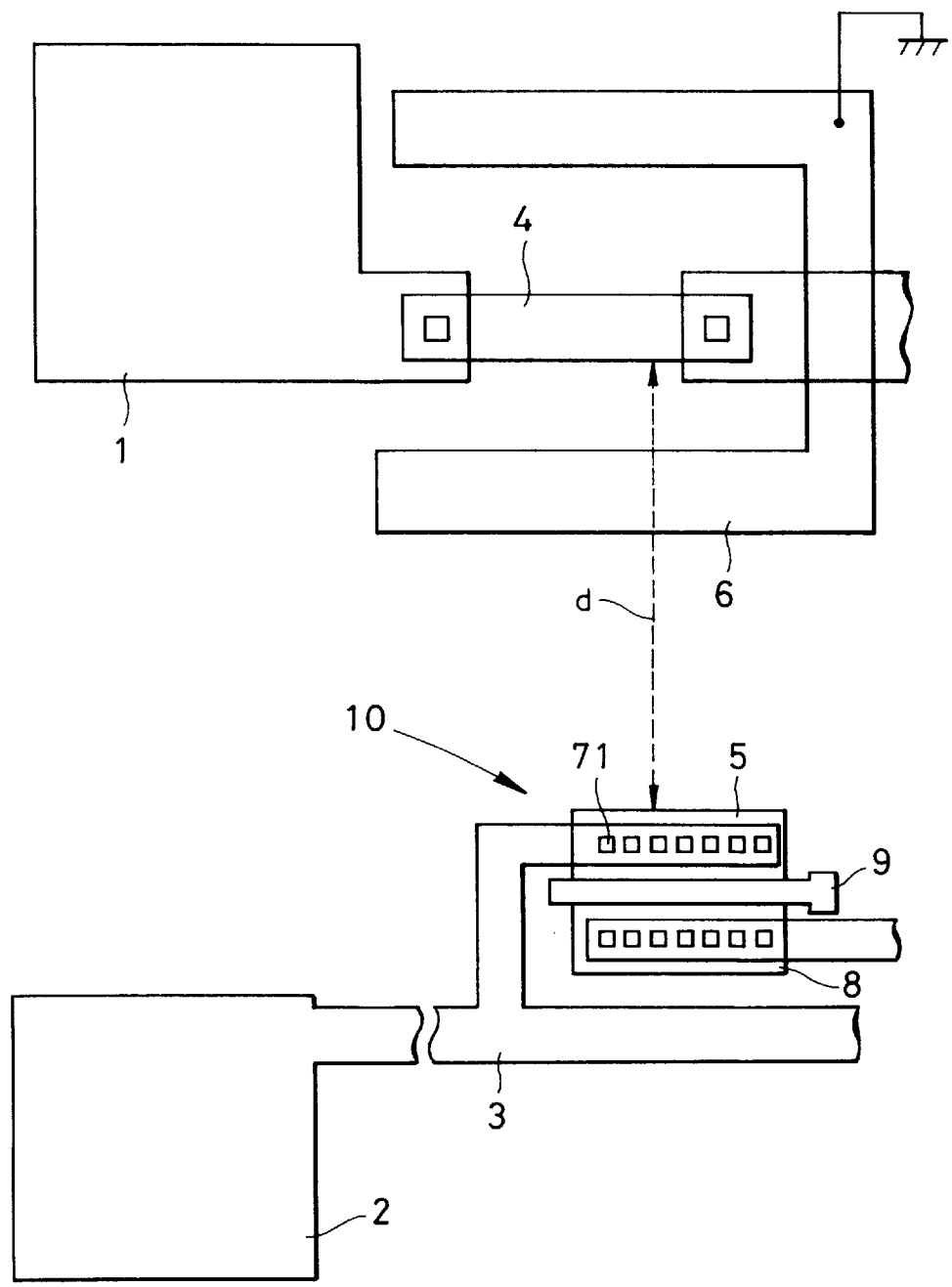
FIG. 11 is an illustration of a layout of another conventional of a semiconductor integrated circuit.
Figure 12:
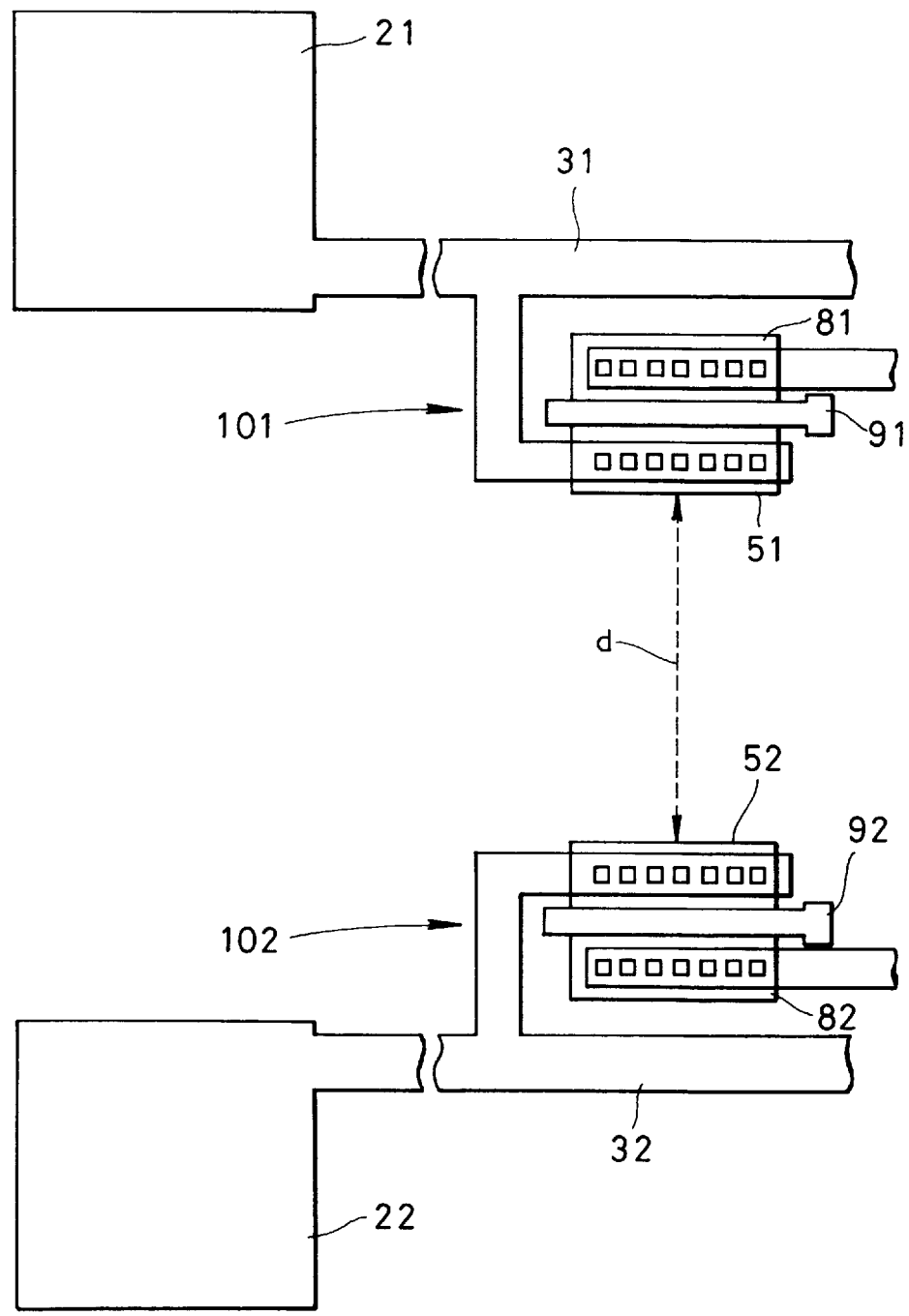
FIG. 12 is an illustration of a layout of a further conventional of a semiconductor integrated circuit.

FIG. 1 is a plan view showing one embodiment of a semiconductor integrated circuit device according to the invention, and FIGS. 2 and 3 are sections along lines A—A and B—B. FIG. 1 shows a layout in the vicinity of an input terminal applied for a MOSLSI formed on one major surface of a P-type semiconductor substrate 20. In FIGS. 1 to 3, same portions to those of FIGS. 11, 12 are represented by the same reference numerals.

An input terminal 1 is connected to an input protective resistor 4 which is formed with an N-type diffusion layer.

The input signal supplied to the input terminal 1 is fed to an internal circuit via the input protective resistor 4. With distances d1 and d2 from the N-type diffusion layer 4, N-type MOSFETs 101 and 102 having source diffusion layers 51 and 52 connected to the grounding wire 3, for internal circuit, are formed, respectively. The drain diffusion layers 81 and 82 are frequently connected to other MOSFET (not shown). For instance, in case of CMOSLSI, the drain diffusion layers 81 and 82 are connected to P-type MOSFETs.

In the shown embodiment, the distance d1 is 20 $\mu$m and the distance d2 is 150 $\mu$m. Since the distance d2 is greater than a critical distance dcr=100 $\mu$m, in the MOSFET 102, the source diffusion layer 52 is directly connected to the grounding wiring 3. On the other hand, since the distance d1 is smaller than the critical distance dcr=100 $\mu$m, in the MOSFET 101, connection between the grounding wiring 3 and the source diffusion layer 52 is established via a tungsten silicide wiring 11 as high melting metal. This manner is as illustrated in FIGS. 2 and 3.

Namely, in FIGS. 2 and 3 the grounding wire 3 is formed with an aluminum wiring and is connected to the tungsten silicide wiring 11 by the first contact 71, and is connected to the source diffusion layer 51 with a second contact 72 via a resistor of tungsten silicide wiring 11.

With taking such constriction, even when the negative electrostatic pulse is applied to the input terminal 1 with respect to the potential of the grounding wiring 3, and electron is injected into the semiconductor substrate 20 from the N-type diffusion layer 4 and diffused to reach the source diffusion layer, a current can be limited by the resistance of the tungsten silicide wiring 11. Therefore, despite of the fact that the distance d1 in the embodiment of FIG. 1 is short, i.e. 20 $\mu$m, breakdown of the source region or breakdown of the gate oxide layer is difficult to be caused. As the wiring 11, any high melting point metal having high resistance can be employed. Furthermore, it is also possible to employ high resistance metal, such as polycrystalline silicon and so forth, can be used.

While the critical distance dcr is set at 100 $\mu$m in the shown embodiment, the practical value of the critical distance should be normally differentiated depending upon the conditions, such as thickness of the gate oxide layer, depth of the diffusion layer, reference impurity concentration and so forth. Practically, the critical distance dcr is determined in a range to cause no problem in the normal practical use on the basis of the relationship between the withstanding voltage against the electrostatic breakdown and the distance d.

Figure 4:
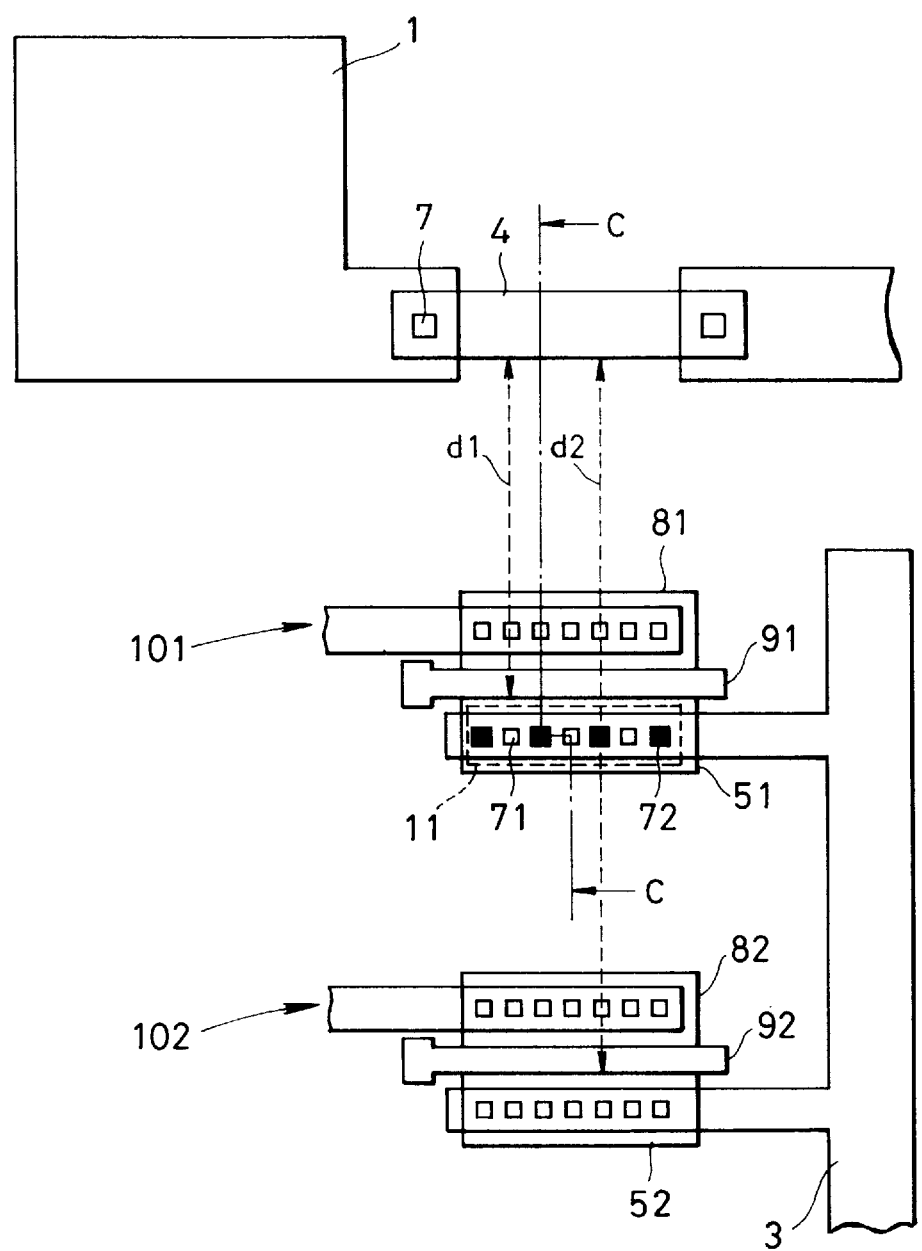
FIG. 4 is an illustration of a layout of another embodiment of a semiconductor integrated circuit device according to the present invention.
Figure 5:
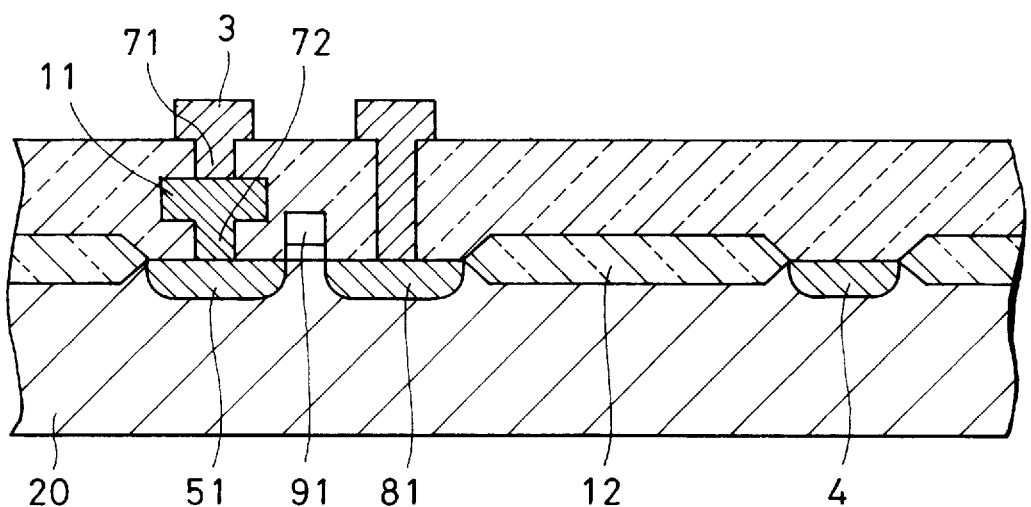
FIG. 5 is a section taken along line C—C of FIG. 4.

FIG. 4 is a plan view of another embodiment of the semiconductor integrated circuit device according to the invention, and FIG. 5 is a section taken along line C—C of FIG. 4. The shown embodiment is directed to an example where the source diffusion layer 51 of the MOSFET is distanced from the N-type diffusion later 4 in a distance greater than that of the drain diffusion layer 81. Even in this case, the construction is identical to that in the first embodiment of FIG. 1. Namely, since the distance d1 is smaller than the critical distance dcr, the grounding wiring 3 is connected to the source diffusion layer 5 via the high resistance wiring, such as the tungsten silicide 11. On the other hand, since the distance d2 is greater than the critical distance dcr, the grounding wiring 3 is directly connected to the source diffusion layer 52.

Figure 7:
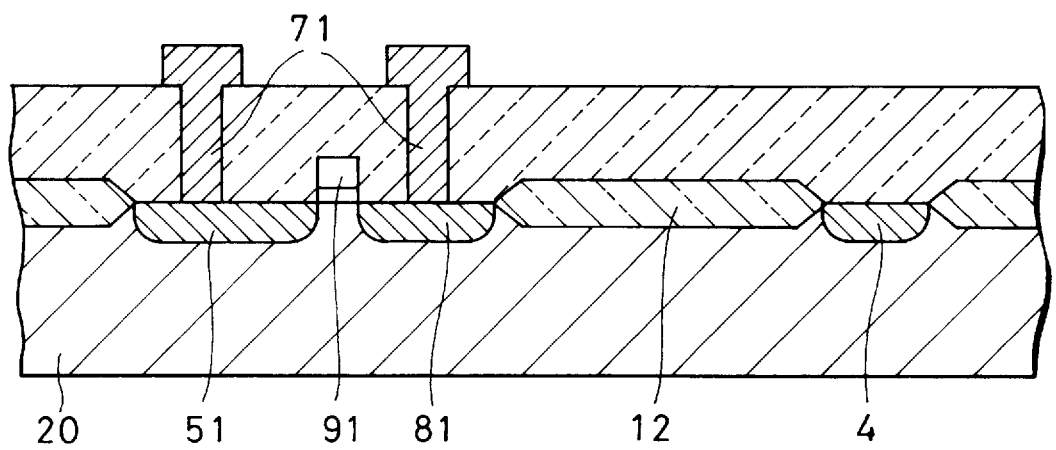
FIG. 7 is a section taken along line D—D of FIG. 6.
Figure 6:
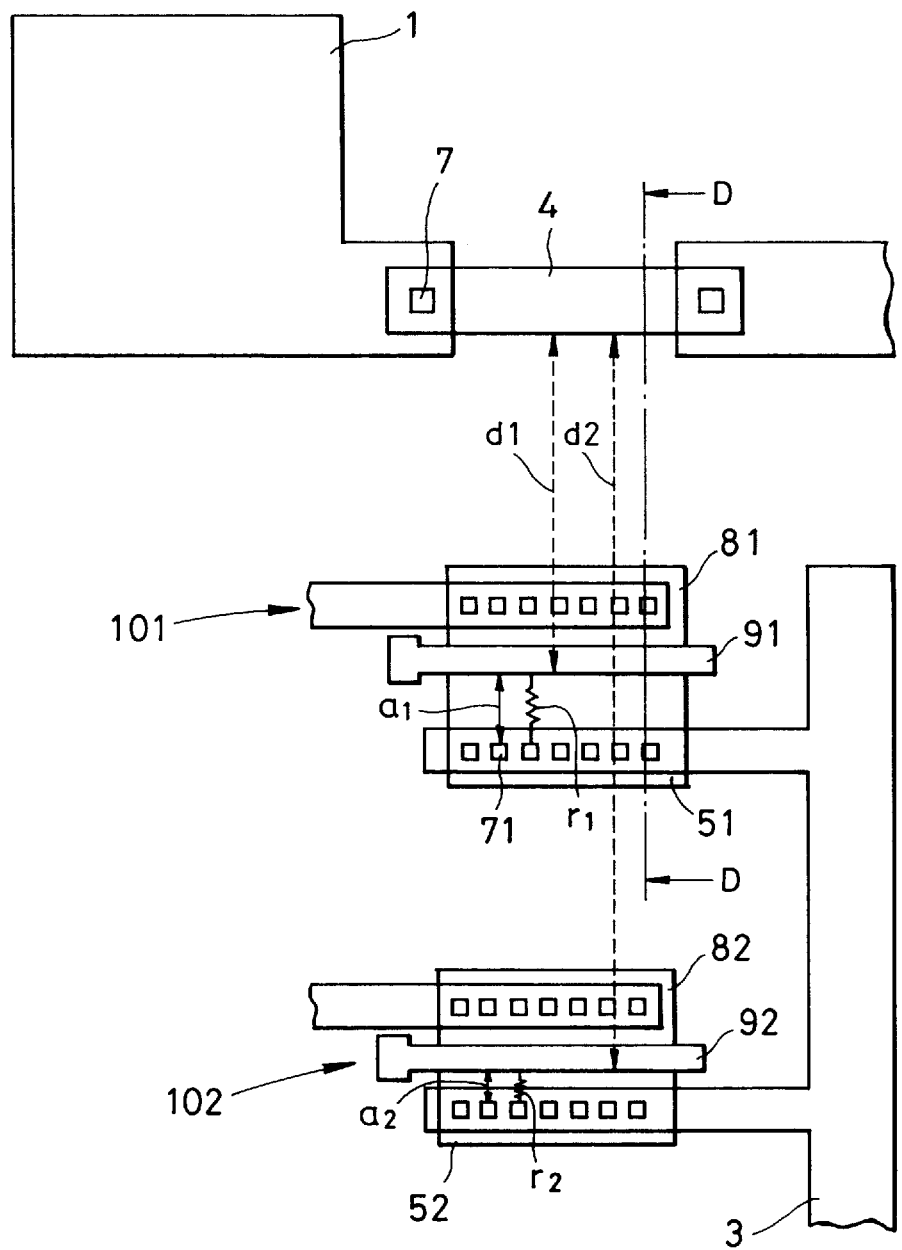
FIG. 6 is an illustration of a layout of a further embodiment of a semiconductor integrated circuit device according to the present invention.

FIG. 6 is a plan view of a further embodiment of the semiconductor integrated circuit device according to the invention, and FIG. 7 is a section taken along line D—D of FIG. 6. In this embodiment, like elements to the embodiment of FIG. 4 are represented by like reference numerals. Since the distance d1 between MOSFET 101 and the N-type diffusion layer 4 is 20 $\mu$m which is smaller than the critical distance of 100 $\mu$m, the distance a1 from the contact portion 71 between the grounding wiring 3 and the source diffusion layer 51 to the end of the source diffusion layer at the side of a gate electrode 91 is set to be 3 $\mu$m.

On the other hand, a distance a2 from the contact portion 72 to the end of the source diffusion layer of the side of the gate electrode 92 in the MOSFET 102 is set at the minimum design dimension, i.e. 0.5 $\mu$m since d2 is 150 $\mu$m which is greater than the critical distance. As set forth above, with respect to the transistor where the distance to the N-type diffusion layer 4 is smaller than the critical distance dcr, the distance a1 from the contact portion between the source diffusion layer and the grounding wiring to the end portion of the source diffusion layer of the gate electrode side is set greater than a2 to increase the parasitic resistance r1 to be greater than that of the parasitic resistance r2 of the diffusion layer of the transistor having greater distance to the N-type diffusion layer 4 to limit the electrostatic discharge current to increase the withstanding voltage against the breakdown potential.

Figure 8:
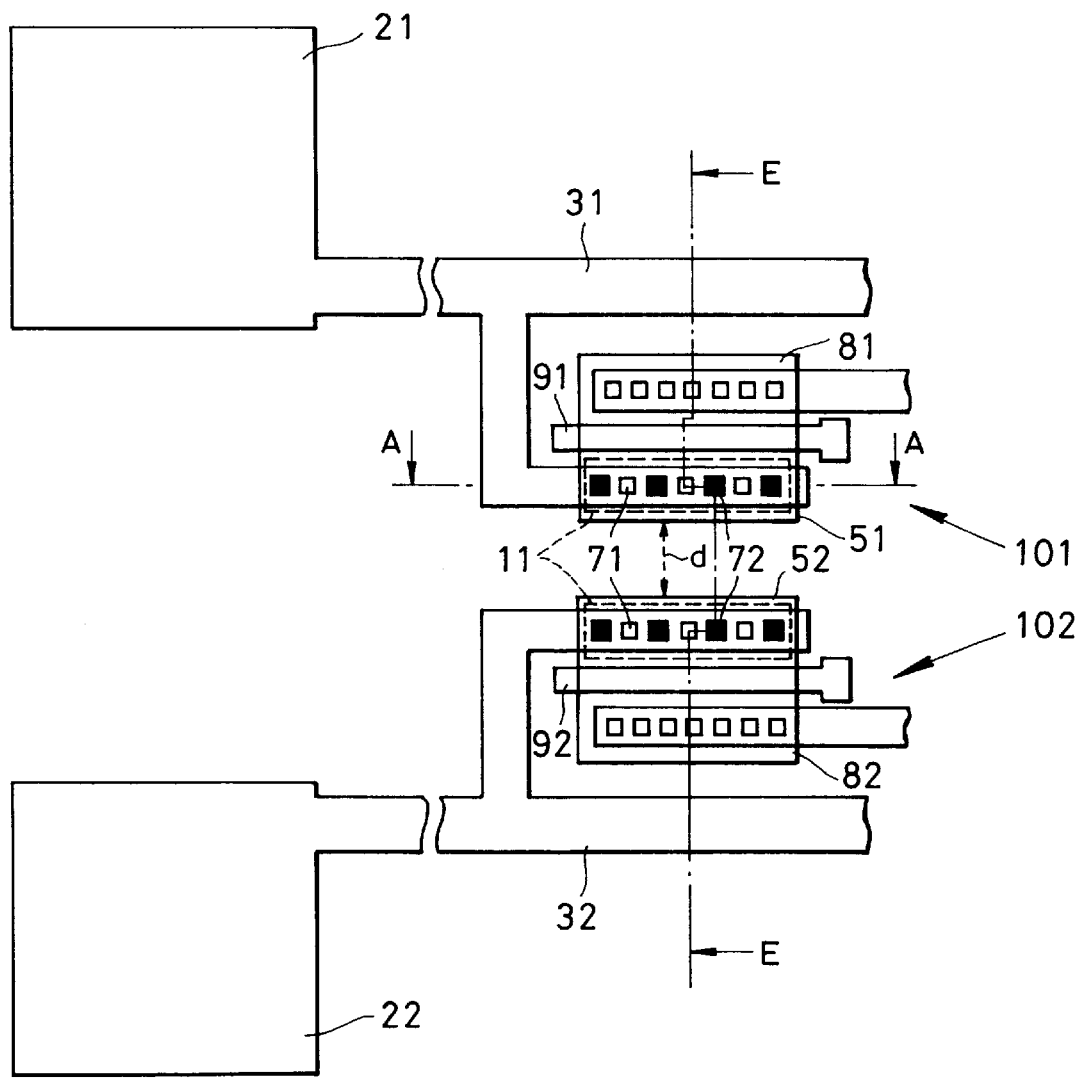
FIG. 8 is an illustration of a layout of a still further embodiment of a semiconductor integrated circuit device according to the present invention.
Figure 9:
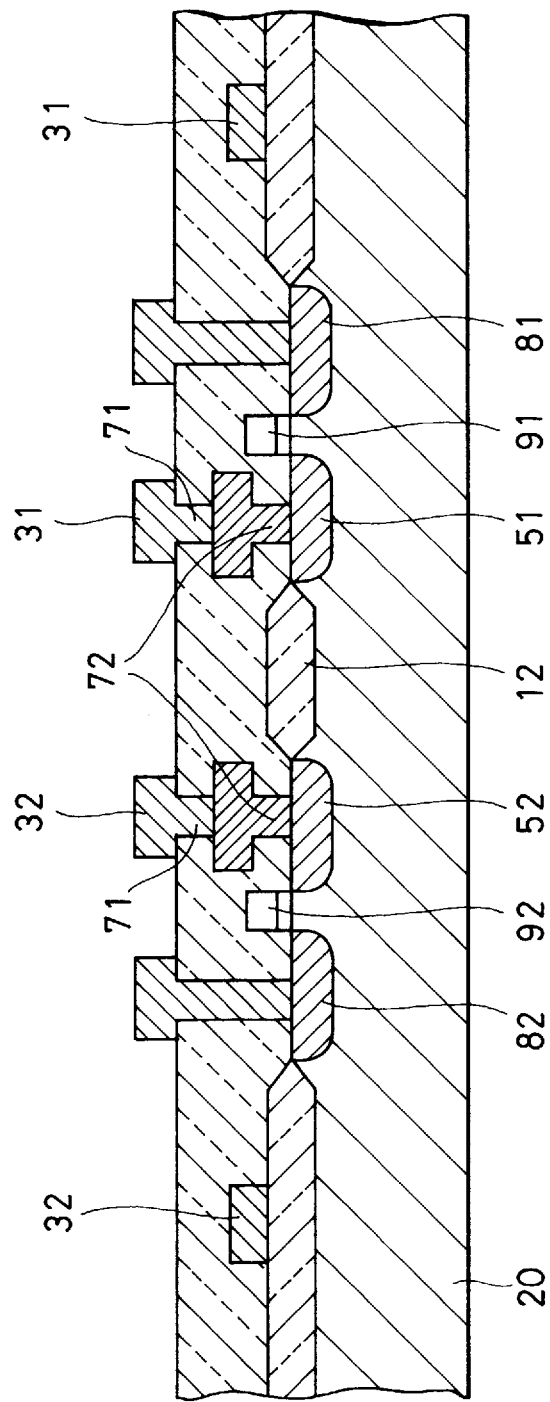
FIG. 9 is a section taken along line E—E of FIG. 8.
Figure 10:
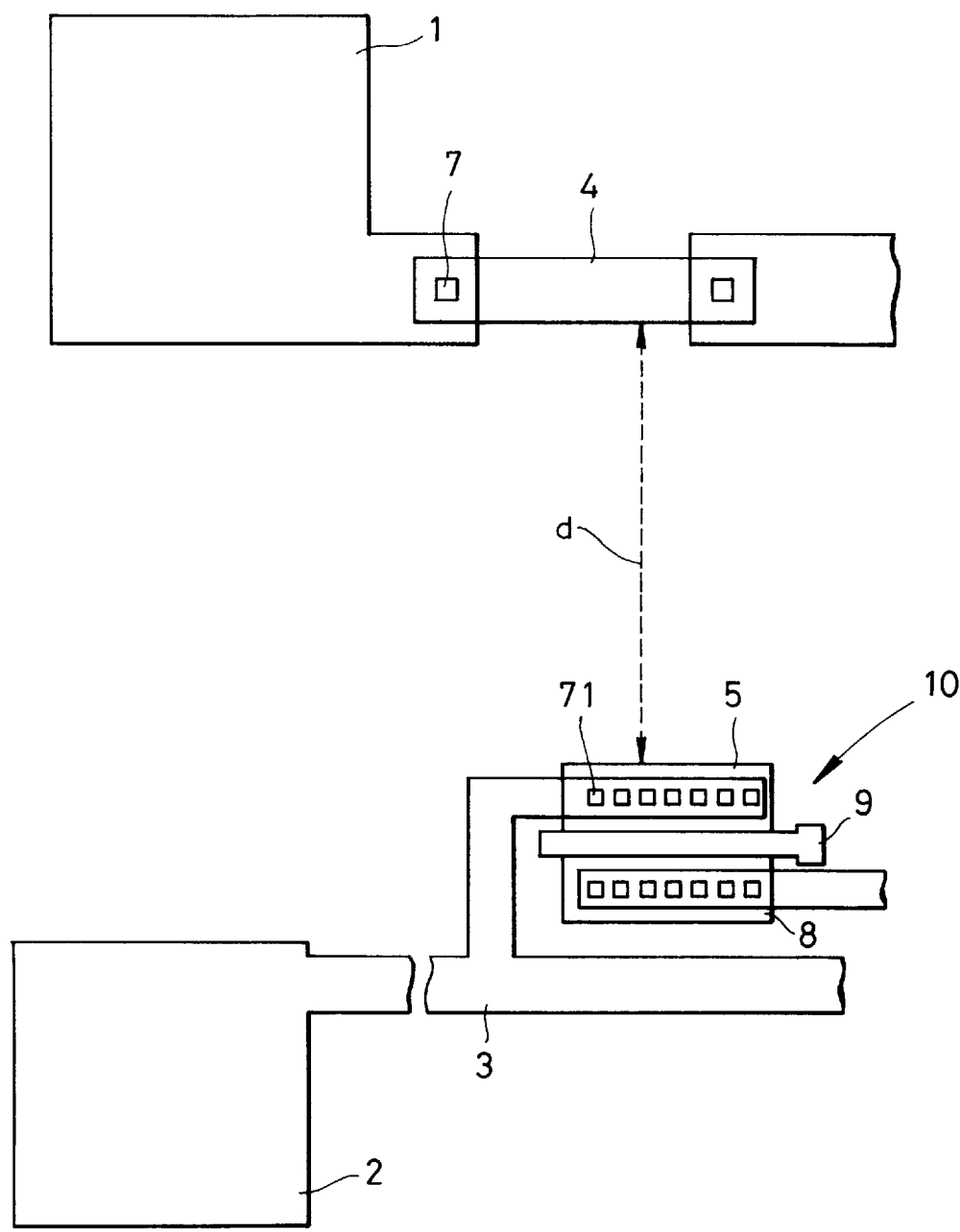
FIG. 10 is an illustration of a layout of the conventional of a semiconductor integrated circuit.

FIG. 8 is a plan view of a still further embodiment of the semiconductor integrated circuit device according to the invention, and FIG. 9 is a section taken along line E—E of FIG. 8. The shown embodiment is direct to an application of the present invention for improvement of the conventional semiconductor integrated circuit device shown in FIG. 12. The source diffusion layer 51 of MOSFET 101 is connected to the grounding wiring 31, and the source diffusion layer 52 of MOSFET 102 is connected to the grounding wiring 32. The grounding wirings 31 and 32 are respectively connected to independent grounding terminals 21 and 22.

Since a distance d between MOSFETs 101 and 102 is smaller than the predetermined critical distance dcr, respective grounding wirings 31 and 32 and the diffusion layers 51 and 52 of MOSFETs 101, 102 are connected via tungsten silicide wirings 11. The sectional structure along line A—A is the same as that along line A—A of FIG. 1 and as illustrated in FIG. 2.

With such constriction, even when either positive polarity or negative polarity of electrostatic pulse is applied between the grounding terminals 21 and 22, the current is limited by the wiring 11 of the resistance of the high resistance and high melting point conducive material, such as the tungsten silicide wiring. Therefore, even when the sufficient distance is not provided, sufficiently high electrostatic breakdown potential can be obtained.

It should be noted that while FIG. 8 illustrates the relationship between the internal circuit elements of the MOSFETs 101 and 102, it is equally applicable for the relationship between the input protective resistor element and the MOSFET elements as the internal circuit elements, similarly to the embodiments of FIGS. 1 and 4.

While the respective of the foregoing embodiments are directed to the case where the source diffusion layer of MOSFET is connected to the grounding wiring, the present invention is equally applicable for the source portion in the case where source diffusion layer is connected to the power source wiring. On the other hand, it is also possible to apply the present invention for the drain portion when the drain diffusion layer is connected to the power source wiring or the grounding wiring.

It should be noted that the grounding terminals can be either positive power source terminal or negative power source terminal. Also, the semiconductor substrate is not limited to the P- type, but can be N-type.

As set forth above, while the dead space where no element is arranged is provided in the region in the vicinity of the terminal or within the region of the internal circuit for lowering of the electrostatic breakdown potential in the prior art, the present invention may avoid such requirement for the dead space to reduction of the chip size in the extent corresponding to the dead space.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A semiconductor device comprising:

a semiconductor substrate of a first conductive type;

first and second terminals formed on one major surface of said semiconductor substrate;

first and second wiring layers respectively connected to said first and second terminals;

a first diffusion layer of a second conductive type selectively formed on one major surface of said semiconductor substrate and connected to said first wiring layer;

a first field effect transistor located in said semiconductor substrate within a predetermined distance relative to said first diffusion layer and having a drain or source diffusion layer connected to said second wiring;

a second field effect transistor located in said semiconductor substrate in a distance greater than said predetermined distance from said first diffusion layer and having drain or source diffusion layer connected to said second wiring, a connection wiring for connecting between said second wiring layer and said drain or source diffusion layer in said first field effect transistor, where said connection wiring having a higher resistance than that of a second connection wiring for connecting between said second wiring and said drain or source diffusion layer in said second field effect transistor.

2. A semiconductor device as set forth in claim 1, wherein said first diffusion layer is an input protective resistor.

3. A semiconductor device as set forth in claim 1, wherein said drain or source diffusion layer is connected to said second wiring layer via a high melting point metal layer.

4. A semiconductor device as set forth in claim 1, wherein said drain or source diffusion layer is connected to said second wiring layer via a polycrystalline silicon layer.

5. A semiconductor device as set forth in claim 1, wherein a distance from a connecting portion between the drain or source diffusion layer and said second wiring layer to said gate electrode, in said first field effect transistor, is greater than that of said second field effect transistor.

6. A semiconductor device as set forth in claim 1 wherein each of said first and second terminals is either a power source terminal or a grounding terminal.

7. A semiconductor device as set forth in claim 1, wherein said first terminal is a signal input terminal of a semiconductor integrated circuit device and said second terminal is one of a power source terminal and a grounding terminal, and said first diffusion layer is an input protective resistor.

8. A semiconductor device comprising:

a first diffusion layer of a second conductive type provided on a semiconductor layer of a first conductive type;

a second diffusion layer of a second conductive type provided in opposition to said first diffusion layer;

a first power source wiring connected to said second diffusion layer;

a third diffusion layer located to a distance from said first diffusion layer greater than that between said first diffusion layer and said second diffusion layer; and a second power source wiring connected to said third diffusion layer, a connection wiring for connecting between said second diffusion layer and said first power source wiring being higher resistance than that of a connection wiring for connecting between said third diffusion layer and said second power source wiring.

9. A semiconductor device as set forth in claim 8 wherein said semiconductor layer is a second conductive type well layer provided on said one major surface of said semiconductor substrate.

10. A semiconductor device comprising:

a first diffusion layer of a second conductive type connected to a first power source wiring provided on a semiconductor substrate of a first conductive type;

a second diffusion layer of a second conductive type connected to a second power source wiring provided in opposition to said first diffusion layer; and a third diffusion layer of a second conductive type connected to an internal circuit wiring, a connection wiring for connecting between said first power source wiring and said first diffusion layer and a connection wiring for connecting between said second power source wiring and said second diffusion layer being higher resistance than that of a connection wiring for connecting between said internal circuit wiring and said third diffusion layer.

* * * * *